(12) United States Patent
Parlos et al.

(10) Patent No.: US 6,590,362 B2
(45) Date of Patent: Jul. 8, 2003

(54) METHOD AND SYSTEM FOR EARLY DETECTION OF INCIPIENT FAULTS IN ELECTRIC MOTORS

(75) Inventors: Alexander G Parlos, College Station, TX (US); Kyusung Kim, Minnetonka, MN (US)

(73) Assignee: Texas A&M University System, College Station, TX (US)

( * ) Notice: Subject to any disclaimer, the term of this patent is extended or adjusted under 35 U.S.C. 154(b) by 0 days.

(21) Appl. No.: 10/207,105

(22) Filed: Jul. 29, 2002

(65) Prior Publication Data

US 2003/0067277 A1 Apr. 10, 2003

Related U.S. Application Data

(60) Provisional application No. 60/308,239, filed on Jul. 27, 2001.

(51) Int. Cl.$^7$ ................................................. H02P 7/36
(52) U.S. Cl. ...................... 318/799; 318/801; 318/802; 318/809
(58) Field of Search ................................. 318/798–802, 318/807–811; 702/115, 185

(56) References Cited

U.S. PATENT DOCUMENTS

| | | | |
|---|---|---|---|
| 5,467,025 A | | 11/1995 | Ray |
| 5,566,092 A | * | 10/1996 | Wang et al. ............... 702/185 |
| 5,745,382 A | | 4/1998 | Vilim et al. |
| 6,069,467 A | | 5/2000 | Jansen |
| 6,288,513 B1 | | 9/2001 | Green |
| 6,301,572 B1 | | 10/2001 | Harrison |
| 6,388,420 B1 | | 5/2002 | Jansen et al. |
| 6,393,373 B1 | * | 5/2002 | Duyar et al. ............... 702/115 |

OTHER PUBLICATIONS

First Author Zamora "Rotor Speed Estimator for Induction Motors Using Voltage and Current Measurements" from Control Engineering Practice 6 (1998) 369–383.
First Author Schauder "Adaptive Speed Identification for Vector Control of Induction Motors without Rotational Transducers" from IEEE Transactions of Industry Applications, vol. 28, No. 5 (Sep./Oct. 1992).
First Author Buja "Accuracy of the Speed Estimation in the Sensorless Induction Motor Drives Based on the MRAS Technique".
First Author Armstrong "A Comparison of Estimation Techniques for Sensorless Vector Controlled Induction Motor Drives," IEEE (1997).

(List continued on next page.)

*Primary Examiner*—Khanh Dang
(74) *Attorney, Agent, or Firm*—Bracewell & Patterson, L.L.P.

(57) ABSTRACT

A method and system for early detection of incipient faults in an electric motor are disclosed. First, current and voltage values for one or more phases of the electric motor are measured during motor operations. A set of current predictions is then determined via a neural network-based current predictor based on the measured voltage values and an estimate of motor speed values of the electric motor. Next, a set of residuals is generated by combining the set of current predictions with the measured current values. A set of fault indicators is subsequently computed from the set of residuals and the measured current values. Finally, a determination is made as to whether or not there is an incipient electrical, mechanical, and/or electromechanical fault occurring based on the comparison result of the set of fault indicators and a set of predetermined baseline values.

15 Claims, 4 Drawing Sheets

OTHER PUBLICATIONS

First Author: Hurst "Sensorless Speed Measurement Using Current Harmonic Spectral Estimation in Induction Machine Drives," IEEE Transactions on Power Electronics, vol. 11, No. 1 (Jan. 1996).

First Author Blasco–Gimenez "Performance of FFT–Rotor Slot Harmonic Speed Detector for Sensorless Induction Motor Drives," IE Proceedings Elctr. Power Appl. vol. 143, No. 3 (May 1996).

First Author Orlowska–Kowalska "Neural network Application for Flux and Speed Estimation in the Sensorless Induction Motor Drive," IEEE Catalog No. 97TH82890 (1997).

First Author Mehrotra "Speed Estimation of Induction Motor Using Artificial Neural Networks," IEEE (1996).

First Author Ben–Brahim "Identification of Induction Motor speed Using Neural Networks," TH0406 (1993) IEEE.

First Author Kazmierkowski "Sensorless Control of Induction Motor Using a Neural network for speed Estimation," IEEE Catalog No. 97TH8280 (1997).

First Author Stronach "Design, DSP Implementation and Performance of Artificial–Intelligence–Based sped Estimator for Electromechanical Drives," IEEE Proc. Control Theory Appl. vol. 145, No. 2 (Mar. 1998).

First Author Ferrah "A Speed Identifier for Induction Motor Drives Using Real–Time Adaptive Digital Filtering," IEEE Transactions on Industry Applications, vol. 34, No. 1 (Jan./Feb. 1998).

First Author Benbouzid "A Review of Induction Motors Signature Analysis as a Medium for Faults Detection," IEEE (1998).

First Author Schoen "Effects of Time Varying Loads on Rotor Fault Detection in Induction Machines," IEEE Transactions on Industry Applications, vol. 31, No. 4 (Jul./Aug. 1995).

First Author Schoen "Motor Bearing Damage Detection using Stator Current Monitoring," IEEE Transactions on Industry Applications, vol. 31, No. 6 (Nov./Dec. 1995).

First Author Thomson "On Line Current Monitoring for Fault Diagnosis in Inverted Fed Induction Motors".

First Author Benbouzid "Induction Motors' Faults Detection and Localization Using Stator Current Advanced Signal Processing Techniques," IEEE Transactions on Power Electronics, vol. 14, No. 1 (Jan. 1999).

First Author Yazici "An Adaptive Statistical Time–Frequency Method for Detection of Broken Bars and Baring Faults in Motors Using Stator Current," IEEE Transactions on Industry Applications, vol. 35, No. 2 (Mar./Apr. 1999).

First Author Hayasi "Study of machine Fault Diagnosis System Using Neural Networks," IEEE (2002).

First Author Filippetti "Recent Developments of Induction Motor Drives Fault Diagnosis Using AI Techniques," IEEE Transactions on Industrial Electronics, vol. 47, No. 5 (Oct. 2000).

* cited by examiner

METHOD AND SYSTEM FOR EARLY DETECTION OF INCIPIENT FAULTS IN ELECTRIC MOTORS

CROSS-REFERENCE TO RELATED APPLICATION

The present application claims the priority of a provisional patent application serial No. 60/308,239, filed Jul. 27, 2001, which is incorporated herein by reference.

STATEMENT REGARDING FEDERALLY SPONSORED RESEARCH

The present invention was made under government Grant No. DE-FG07-98ID13641, awarded by the Department of Energy. The United States Government has a paid-up license in the present invention and the right, in limited circumstances, to require the patent owner to license others on reasonable terms as provided for under the terms of Grant No. DE-FG07-98ID13641.

BACKGROUND OF THE INVENTION

1. Technical Field

The present invention relates to a method and system for early detection of incipient faults in electric motors in general, and in particular to a neural network-based method and system for detecting incipient electrical, mechanical and electromechanical faults in electric motors.

2. Description of the Related Art

Approximately 60% of all incipient motor failures can be attributed to mechanical and electromechanical causes. Thus, many efforts have been made towards the early detection of incipient mechanical and electromechanical motor faults, and the most widely accepted approach for detecting incipient mechanical and electromechanical faults are vibration monitoring and motor current monitoring, respectively. The monitoring of the negative sequence of motor current and motor impedance is also widely used for the detection of incipient electrical motor faults. However, none of the above-mentioned approaches provides adequate indicators for the detection of incipient electrical, mechanical and electromechanical faults. For example, frequent changes in the temporal behavior of a power supply cause imbalances, which can obscure a fault signature and lead one to believe that there is an incipient electrical fault occurring even though the root-cause of the problem is supply imbalances. As such, the effectiveness of the conventional methods for detecting incipient electrical, mechanical and electromechanical faults in electric motors is significantly diminished.

Consequently, it would be desirable to provide an improved method and system for the early detection of incipient electrical, mechanical and electromechanical faults in electric motors.

SUMMARY OF THE INVENTION

In accordance with a preferred embodiment of the present invention, current and voltage values for one or more phases of an electric motor are measured during motor operations. A set of current predictions is then determined based on the measured voltage values and an estimate of motor speed values of the electric motor via a neural network-based current predictor. Next, a set of residuals is generated by combining the set of current predictions with the measured current values. A set of fault indicators is subsequently computed from the set of residuals and the measured current values. Finally, a determination is made as to whether or not there is an incipient electrical, mechanical, and/or electromechanical fault occurring based on the comparison result of the set of fault indicators and a set of predetermined baseline values.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

I. Electric Motor Assembly

Figure 1:
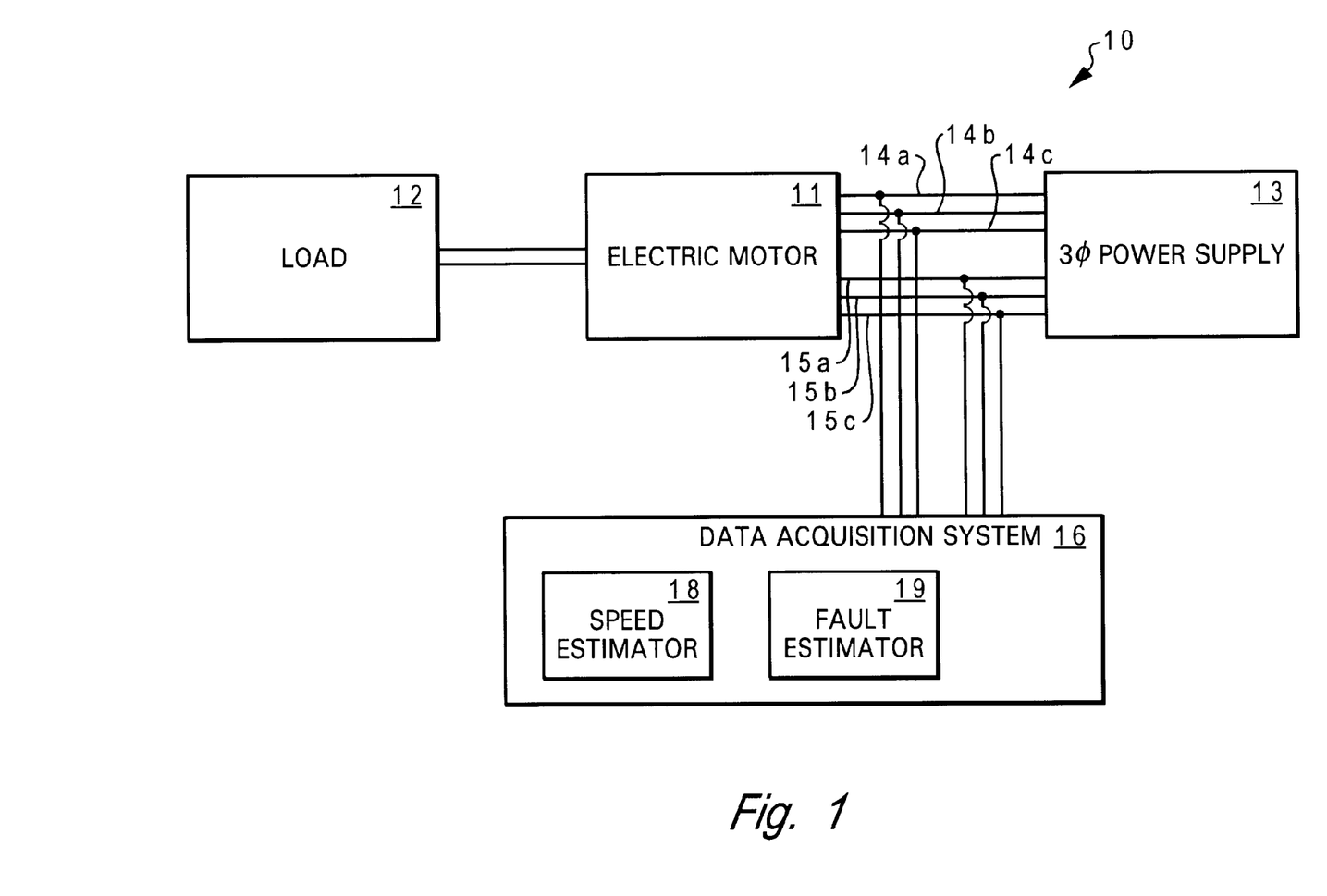
FIG. 1 is a block diagram of an electric motor assembly, in accordance with a preferred embodiment of the present invention.

Referring now to the drawings and in particular to FIG. 1, there is depicted a block diagram of an electric motor assembly, in accordance with a preferred embodiment of the present invention. As shown, an electric motor assembly 10 includes an electric motor 11, a three-phase power supply 13, and a data acquisition system 16. Electric motor 11 is preferably a three-phase motor that is powered by three-phase power supply 13 via three voltage inputs 14a–14c and three current outputs 15a–15c. It is understood by those skilled in the art that electric motor 11 can be of any size having any number of phases. Electric motor 11 is shown to be connected to a load 12. Data acquisition system 16 is operably associated with each of voltage inputs 14a–14c and each of cur rent inputs 15a–15c via a respective potential transformer sensor (not shown) and a respective current transformer sensor (not shown), which are well-known to those skilled in the art. The potential transformer sensors and the current transformer sensors can non-intrusively measure the voltage values at voltage inputs 14a–14c and the current values at current outputs 15a–15c without affecting the normal operations of electric motor 11. Data acquisition system 16 may be implemented with a data processing system having a general purpose processor or a digital signal processor, that is well-known to those skilled in the art. In addition, data acquisition system 16 includes a speed estimator 18 and a fault estimator 19. Fault estimator 19 is used to determine the health or condition of electric motor 11 at the present time, given data measurements up to and including the present time.

II. Neutral Network-based Methods

According to the present invention, a group of dynamic recurrent neural networks are used to predict the input-output response of a three-phase electric motor, such as electric motor 11, by using standard motor voltage readings and an estimation of the motor speed. The estimation of motor speed can be performed by speed estimator 18 or any kind of speed sensor that is well-known in the art. Standard motor voltage readings and the motor speed estimations are subsequently utilized by the group of dynamic recurrent neural networks to predict motor current values. Thus, the input-output motor model of the present invention requires no knowledge of the motor specifics and instead, only motor nameplate information are used.

A. Quasi-stationary Motor Operations

Figure 2:
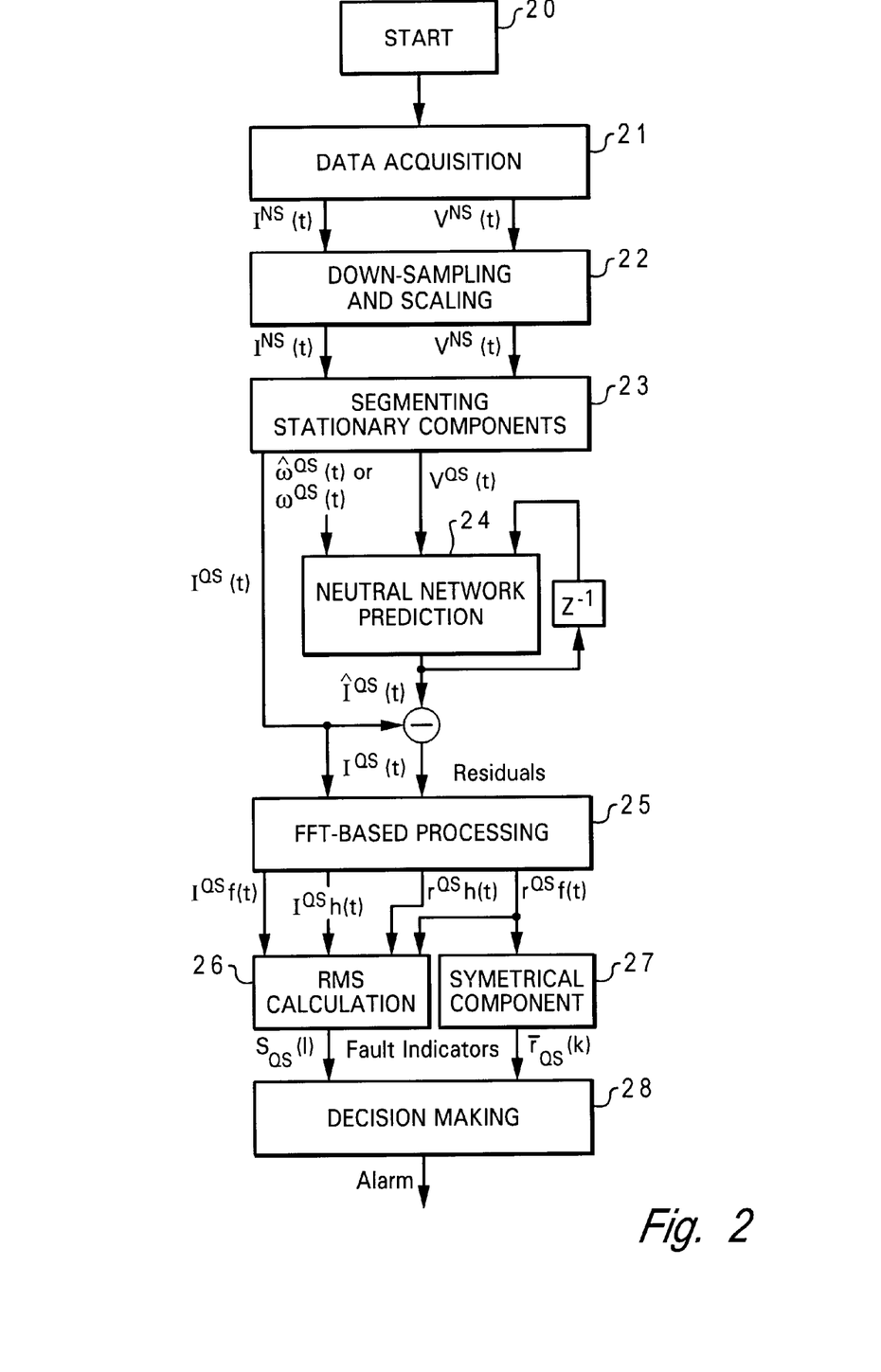
FIG. 2 is a high-level logic flow diagram of a method for an early detection of electrical, mechanical and/or electromechanical faults in an electric motor operating in a quasi-stationary mode, in accordance with a preferred embodiment of the present invention.

With reference now FIG. 2, there is illustrated a high-level logic flow diagram of a method for an early detection of electrical, mechanical and/or electro-mechanical faults in an electric motor operating in a quasi-stationary mode, in accordance with a preferred embodiment of the present invention. Starting at block 20, voltage ($V^{NS}(t)$) and current ($I^{NS}(t)$) information are acquired from an electric motor, as shown in block 21, and the acquired voltage and current information are then down-sampled and scaled accordingly, as depicted in block 22. Quasi-stationary voltage components ($V^{QS}(t)$) and quasi-stationary current components ($I^{QS}(t)$) are extracted from the acquired voltage and current information, as shown in block 23. Next, a set of current predictions is generated using a neutral network-based current predictor, as depicted in block 24. The details of the neutral network-based current predictor and the process of generating the current predictions using the neutral network-based current predictor will be further described in details. The quasi-stationary current components ($I^{QS}(t)$) and the residuals ($r^{QS}(t)$) computed from the current predictions are further processed to yield various harmonics, using a Fast-Fourier Transform (FFT) based algorithm, as shown in block 25. The usage of an FFT-based algorithm to generate frequency domain harmonics are well known in the art. Then, fault indicators $S_{QS}(l)$ and $r_{QS}(k)$ are generated by a windowed root-mean-square (RMS) calculation as depicted in block 26, and a windowed symmetrical component calculation as shown in block 27, respectively. The fault indicators $S_{QS}(l)$ and $r_{QS}(k)$ are then compared with a set of previously computed baseline values to determine whether or not an incipient electrical, mechanical and/or electromechanical fault have occurred in the electric motor, as depicted in block 28. Preferably, the fault indicator $S_{QS}(l)$ indicates an incipient mechanical or electromechanical fault has occurred, while the fault indicator $r_{QS}(k)$ indicates that an incipient electrical fault has occurred. If an electrical, mechanical or electromechanical fault has occurred, a visual and/or audio alarm can be triggered.

B. Non-stationary Motor Operations

During normal motor operations, motor voltages and currents are seldom stationary. As a result, the generated residuals from non-stationary signals require more complicated signal processing. In the present implementation, wavelet (multi-resolution) signal processing techniques are used to estimate fault indicators that can be utilized to provide an early detection of electrical, mechanical and/or electromechanical motor faults.

Figure 3:
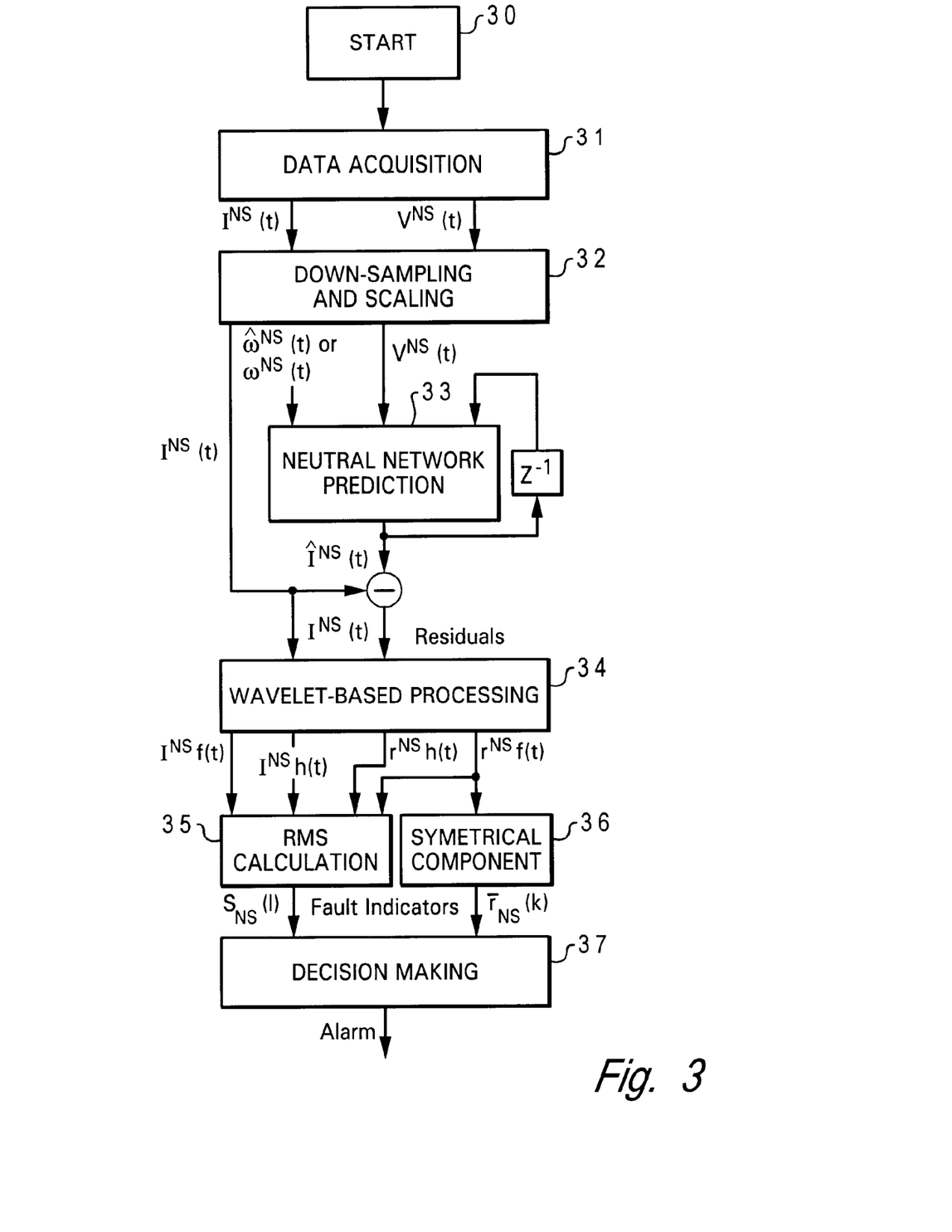
FIG. 3 is a high-level logic flow diagram of a method for an early detection of electrical, mechanical and/or electromechanical faults in an electric motor operating in a non-stationary mode, in accordance with a preferred embodiment of the present invention.

Referring now to FIG. 3, there is depicted a high-level logic flow diagram of a method for an early detection of electrical, mechanical and/or electromechanical faults in an electric motor operating in a non-stationary mode, in accordance with a preferred embodiment of the present invention. Starting at block 30, voltage ($V^{NS}(t)$) and current ($I^{NS}(t)$) information are acquired from an electric motor, as shown in block 31, and the acquired voltage and current information are then down-sampled and scaled accordingly, as depicted in block 32. Next, a set of current predictions is generated using a neutral network-based current predictor, as shown in block 33. The details of the neutral network-based current predictor and the process of generating the current predictions using the neutral network-based current predictor will be further described in details. The measured non-stationary current components ($I^{NS}(t)$) and the residuals ($r^{NS}(t)$) computed from the current predictors are further processed to yield various harmonics, using a wavelet-based algorithm, as depicted in block 34. The usage of a wavelet-based algorithm to generate frequency domain harmonics are well known in the art. Then, fault indicators $S_{NS}(l)$ and $r_{NS}(k)$ are generated by windowed root-mean-square (RMS) calculation as shown in block 35, and the windowed symmetrical component calculation as depicted in block 36, respectively. The fault indicators $S_{NS}(l)$ and $r_{NS}(k)$ are then compared with a set of previously computed baseline values to determine whether or not an incipient electrical, mechanical and/or electromechanical fault have occurred in the electric motor, as depicted in block 37. Preferably, the fault indicator $S_{NS}(l)$ indicates that an incipient mechanical or electromechanical fault has occurred, while the fault indicator $r_{NS}(k)$ indicates that an incipient electrical fault has occurred. If an electrical, mechanical or electromechanical fault has occurred, a visual and/or audio alarm can be triggered.

III. Signal Segmentation Sequence

The segmentation sequence depicted in block 23 of FIG. 2 is preferably performed as follows. A given measurement, Y, is initially transformed by using FFT and the magnitude of the largest harmonic component, $H_{max}$, is subsequently obtained. The de-noising threshold magnitude, Thr, is computed by multiplying a user-defined percentage value, α, with the magnitude of the largest harmonic component, $H_{max}$, as follows:

$$Thr = \alpha \times H_{max}$$

As such, only the frequency components having greater magnitude than a certain percentage of the largest harmonic component are selected for further analysis. The wavelet transform is followed to obtain the de-noised signal, Y', by removing the components having smaller magnitude than the de-noising threshold magnitude, Thr. The selected components are then sorted in the order of magnitude. The wavelet transform is followed by a procedure to obtain the reconstructed signal corresponding to the frequency component, $D_i$, as follows:

$$Y' = \sum_{i=1}^{n} D_i, \quad (D_1 > D_2 \ldots > D_n)$$

where n is the number of frequency components selected after the de-noising step. The signal is broken into the successive windows, and the RMS values for each window are calculated. If the RMS values at successive windows do not vary over a certain range, which is also predefined by user, such as:

$$|RMS_{j+1} - RMS_j| < \beta \text{ for } j=1,2,\ldots,k$$

where β is the user defined threshold and k is the total number of windows in the signal, then the signal is considered to remain stationary at the regions corresponding to those windows. If not, the signal is considered as non-stationary. The RMS value comparison is carried out through the entire signal, and the stationary regions are obtained. This process is iterated throughout all of the frequency components selected in the de-noising step. But at the beginning of the second iteration, the RMS values at successive windows do not need to be compared throughout the entire signal. The comparison needs to be done only at the regions determined as stationary from the previous iteration. Furthermore, if there is more than one measurement, then the entire signal segmentation algorithm should be repeated for all given measurements. In fact, all of the three-phase voltages V(t) and the three-phase current I(t) are analyzed using the above-mentioned signal segmentation process.

IV. Predictor Development

Figure 4:
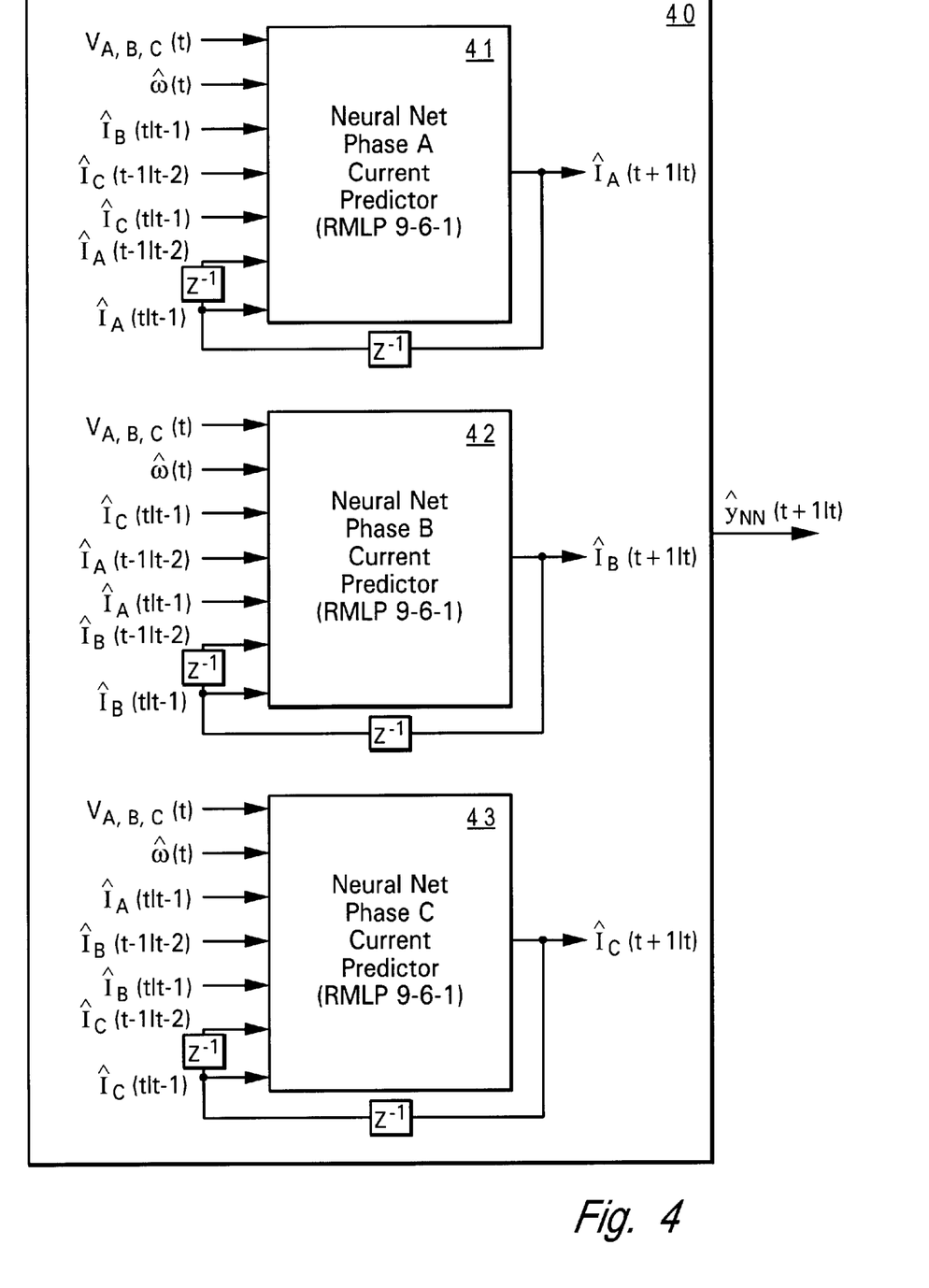
FIG. 4 is a block diagram of a neural network-based system for generating current predictions, in accordance with a preferred embodiment of the present invention.

With reference now to FIG. 4, there is depicted a detailed block diagram of a neural network-based current predictor, in accordance with a preferred embodiment of the present invention. As shown, a neural network-based current predictor 40 includes three neural network current predictors, namely, phase A current predictor 41, phase B current predictor 42, and phase C current predictor 43. Current predictors 41–43, which may be approximated by recurrent multi-layer perceptrons (RMLP), represent dynamic mappings and can be trained using teacher forcing (TF). Current predictors 41–43 are trained using motor voltage measurements V(t), motor current measurements I(t), and speed estimation values $\hat{\omega}(t)$. Current predictors 41–43, each with a 9-6-1 structure and a global feedback, are used for the prediction of the three line currents to yield outputs $\hat{I}_A(t+1|t)$, $\hat{I}_B(t+1|t)$, and $\hat{I}_C(t+1|t)$, concurrently. Although a 9-6-1 structure is used in the present implementation, it is understood by those skilled that any properly obtained structure based on a general neural network architecture is also applicable.

The predictions for the three-phase current can be calculated by the following prediction equations:

$$\hat{y}_{NN}(t+1|t)=[\hat{I}_A(t+1|t;W_A)\hat{I}_B(t+1|t;W_B)\hat{I}_C(t+1|t;W_C)]^T$$

where $$\hat{I}_A(t+1|t;W_A)=F(\hat{U}_A(t),z^A_{[2]}(t);W_A) \quad (1)$$

$$\hat{I}_B(t+1|t;W_B)=F(\hat{U}_B(t),z^B_{[2]}(t);W_B) \quad (2)$$

$$\hat{I}_C(t+1|t;W_C)=F(\hat{U}_C(t),z^C_{[2]}(t);W_C) \quad (3)$$

The 9 inputs to phase A current predictor 41, $\hat{U}_A(t)$, are $$\hat{U}_A(t)=[V(t)\hat{\omega}(t)\hat{I}_A(t-1|t-2)\hat{I}_A(t|t-1)\hat{I}_B(t|t-1)\hat{I}_C(t-1|t-2)\hat{I}_C(t|t-1)]^T$$

where V(t) represents the three-phase motor terminal voltages, $$i\ V(t)=[V_A(t)V_B(t)V_C(t)]^T.$$

Similarly, the 9 inputs to phase B current predictor, $\hat{U}_B(t)$, are $$\hat{U}_B(t)=[V(t)\hat{\omega}(t)\hat{I}_A(t-1|t-2)\hat{I}_A(t|t-1)\hat{I}_B(t-1|t-2)\hat{I}_B(t|t-1)\hat{I}_C(t|t-1)]^T$$

and the 9 inputs to phase C current predictor, $\hat{U}_C(t)$, are $$\hat{U}_C(t)=[V(t)\hat{\omega}(t)\hat{I}_A(t|t-1)\hat{I}_B(t-1|t-2)\hat{I}_B(t|t-1)\hat{I}_C(t-1|t-2)\hat{I}_C(t|t-1)]^T.$$

For prediction equations (1)–(3), $z_{[2]}(t)$ is the internal state vector of the hidden layer having 6 nodes, $$z_{[2]}(t)=[z_{[2,1]}(t),\ldots,z_{[2,6]}(t)]^T,$$

and W is bias and weight matrix that is to be determined by a neutral network learning algorithm, which is appropriate for a selected neutral network architecture, as follows:

$$W=[b_{[2]}b_{[3]}W_{1\to 2}W_{2\to 2}W_{2\to 3}],$$

where the biases at the input layer are $$b_{[2]}=[b_{[2,1]},\ldots,b_{[2,6]}]^T,$$

and the bias at the hidden layer are $$b_{[3]}=[b_{[3,1]}]^T,$$

and the weights from the input layer to the hidden layer are $$W_{1\to 2}=[w_{[1,i][2,j]}],\ i=1,\ldots,9;\ j=1,\ldots,6$$

and the internal wights at the hidden layer are $$W_{2\to 2}=[w_{[2,i][2,j]}],\ i=1,\ldots,6;\ j=1,\ldots,6$$

and the weights from the hidden layer to the output layer are $$W_{2\to 3}=[w_{[2,i][3,j]}],\ i=1,\ldots,6;\ j=1.$$

V. Fault Indicators

If the size of a moving window is $t_2-t_1$, and the moving distance of the window is d, then the negative sequence of the residuals, r(k), (Fault indicator 1) can be obtained by symmetrical component theory as $$r^-(k) = \frac{1}{3}(r_{a,f}(t) + \alpha^2 r_{b,f}(t) + \alpha r_{c,f}(t)),$$

$$t_1 + kd \leq t \leq t_2 + kd, \quad k = 0, 1, \ldots, n$$

where $\alpha=e^{j2\pi/3}$ and $n=(t_N-t_2)/d$.

If the size of a moving window is $t_2-t_1$, and the moving distance of the window is p, then the moving window RMS values are:

$$r_{f,RMS}(l) = \sqrt{\int_{t_1+lp}^{t_2+lp} r_f(t)^2 dt}, \quad l = 0, 1, \ldots, m$$

$$I_{f,RMS}(l) = \sqrt{\int_{t_1+lp}^{t_2+lp} I_f(t)^2 dt}, \quad l = 0, 1, \ldots, m$$

$$r_{h,RMS}(l) = \sqrt{\int_{t_1+lp}^{t_2+lp} r_h(t)^2 dt}, \quad l = 0, 1, \ldots, m$$

$$I_{h,RMS}(l) = \sqrt{\int_{t_1+lp}^{t_2+lp} I_h(t)^2 dt}, \quad l = 0, 1, \ldots, m$$

where $m=(t_N-t_2)/p$. Since fault indicators resulting from mechanical failures are equally contained in all three phases, $r_f(t)$, $I_f(t)$, $r_h(t)$ and $I_h(t)$ can be computed for any of the three phases.

The relative change of the fundamental and harmonics component can be quantified as the ratios $r_{f,RMS}(l)/I_{f,RMS}(l)$ and $r_{h,RMS}(l)/I_{h,RMS}(l)$, respectively. In most cases, the RMS value of current fundamental is incomparably larger than the RMS value of residual fundamental so the normalized RMS value of the residual fundamental, $r_{f,RMS}(l)/I_{f,RMS}(l)$, is very small and its change is also small. Whereas the RMS value of the current harmonics is small enough so that the change in the normalized RMS value of the residual harmonics. $r_{h,RMS}(l)/I_{h,RMS}(l)$, is easily noticeable. The sum of the two normalized RMS values, S(l), (Fault indicator 2) is employed as a fault indicator for detecting the mechanical faults, as follows:

$$S(l) = \frac{r_{f,RMS}(l)}{I_{f,RMS}(l)} + \frac{r_{h,RMS}(l)}{I_{h,RMS}(l)}$$

As has been described, the present invention provides a neural network-based method and system for the early detection of incipient electrical, mechanical and/or electromechanical faults in electric motors. The neutral network-based system, which is developed using recurrent dynamic neural networks, estimates a set of error residuals. The error residuals are then processed for fault indicators extraction in order to provide incipient motor fault detections. The neural network-based system is effective in detecting early stages of winding insulation, broken rotor bars and bearing failures, while distinguishing from false alarms caused by power supply and load variations. The use of model-based fault indicators can potentially eliminate all false alarms due to supply imbalance and load variations, and maintains the fault indicator sensitivity to incipient motor faults at early stages. The methods of the present invention can be extended to include electric motors driven by invertors and other types of measurements, such as vibration levels, and can also be used to detect incipient faults of driven equipment, such as pumps and compressors.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for providing an early detection of incipient electrical, mechanical and/or electromechanical faults in an electric motor, said method comprising:
   acquiring current and voltage values for one or more phases of said electric motor during operation;
   determining motor speed values of said electric motor during said operation;
   determining a plurality of current predictions based on said voltage and said motor speed values via a neural network-based current predictor;
   generating a plurality of residuals by combining said plurality of current predictions and said current values;
   extracting a plurality of fault indicators from said plurality of residuals; and
   determining whether or not an incipient electrical, mechanical or electromechanical fault is occurring by comparing said plurality of fault indicators with a set of predetermined baseline values.

2. The method of claim 1, wherein said extracting step further includes extracting a plurality of fault indicators using a Fast-Fourier Transform based processing technique.

3. The method of claim 1, wherein said extracting step further includes extracting a plurality of fault indicators using a wavelet-based processing technique.

4. The method of claim 1, further includes a step of generating an initial set of fault indicators as said set of predetermined baseline values.

5. The method of claim 1, further includes a step of segmenting stationary components from said acquired current and voltage values for said electric motor operating in a quasi-stationary mode.

6. A computer program product residing on a computer usable medium for providing an early detection of incipient electrical, mechanical and/or electromechanical faults in an electric motor, said computer program product comprising:
   program code means for acquiring current and voltage values for one or more phases of said electric motor during operation;
   program code means for determining motor speed values of said electric motor during said operation;
   program code means for determining a plurality of current predictions based on said voltage and said motor speed values via a neural network-based current predictor;
   program code means for generating a plurality of residuals by combining said plurality of current predictions and said current values;
   program code means for extracting a plurality of fault indicators from said plurality of residuals; and
   program code means for determining whether or not an incipient electrical, mechanical or electromechanical fault is occurring by comparing said plurality of fault indicators with a set of predetermined baseline values.

7. The computer program product of claim 6, wherein said program code means for extracting further includes program code means for extracting a plurality of fault indicators using a Fast-Fourier Transform-based processing technique.

8. The computer program product of claim 6, wherein said program code means for extracting further includes program code means for extracting a plurality of fault indicators using a wavelet-based processing technique.

9. The computer program product of claim 6, further includes a program code means for generating an initial set of fault indicators as said set of predetermined baseline values.

10. The computer program product of claim 6, further includes a program code means for segmenting stationary components from said acquired current and voltage values for said electric motor operating in a quasi-stationary mode.

11. A computer system for providing an early detection of incipient electrical, mechanical and/or electromechanical faults in an electric motor, said computer program product comprising:
   a plurality of sensors for acquiring current and voltage values for one or more phases of said electric motor during operation;
   means for determining motor speed values of said electric motor during said operation;
   a neural network-based current predictor for determining a plurality of current predictions based on said voltage and said motor speed values;
   means for generating a plurality of residuals by combining said plurality of current predictions and said current values;
   means for extracting a plurality of fault indicators from said plurality of residuals; and
   means for determining whether or not an incipient electrical, mechanical or electromechanical fault is occurring by comparing said plurality of fault indicators with a set of predetermined baseline values.

12. The computer system of claim 11, wherein said means for extracting further includes means for extracting a plurality of fault indicators using a Fast-Fourier Transform-based processing technique.

13. The computer system of claim 11, wherein said means for extracting further includes means for extracting a plurality of fault indicators using a wavelet-based processing technique.

14. The computer system of claim 11, further includes a means for generating an initial set of fault indicators as said set of predetermined baseline values.

15. The computer system of claim 11, further includes a means for segmenting stationary components from said acquired current and voltage values for said electric motor operating in a quasi-stationary mode.

* * * * *

UNITED STATES PATENT AND TRADEMARK OFFICE
CERTIFICATE OF CORRECTION

PATENT NO. : 6,590,362 B2  
DATED : July 8, 2003  
INVENTOR(S) : Alexander G. Parlos and Kyusung Kim Page 1 of 1

It is certified that error appears in the above-identified patent and that said Letters Patent is hereby corrected as shown below:

Column 2,  
Line 49, change "cur rent" to -- current --

Column 3,  
Lines 37, 41 and 47, change "$r_{QS}(k)$" to --$\bar{r}_{QS}(k)$"--

Column 4,  
Lines 13, 17 and 23, change "$r_{NS}(k)$" to --$\bar{r}_{NS}(k)$"--

Line 60, before "$RMS_{j+1}$" add -- | --

Column 6,  
Line 28, change "$r(k)$" to --$\bar{r}(k)$"--

Signed and Sealed this

Fourth Day of November, 2003

JAMES E. ROGAN  
*Director of the United States Patent and Trademark Office*